United States Patent [19]

Maekawa

[11] Patent Number: 4,719,183
[45] Date of Patent: Jan. 12, 1988

[54] FORMING SINGLE CRYSTAL SILICON ON INSULATOR BY IRRADIATING A LASER BEAM HAVING DUAL PEAK ENERGY DISTRIBUTION ONTO POLYSILICON ON A DIELECTRIC SUBSTRATE HAVING STEPS

[75] Inventor: Masashi Maekawa, Nara, Japan

[73] Assignee: Sharp Kabushiki Kaisha, Osaka, Japan

[21] Appl. No.: 783,105

[22] Filed: Oct. 2, 1985

[30] Foreign Application Priority Data

Oct. 3, 1984 [JP] Japan .................... 59-209196
Oct. 19, 1984 [JP] Japan .................... 59-220684
Sep. 3, 1985 [JP] Japan .................... 60-195580

[51] Int. Cl.⁴ .............. H01L 21/265; C30B 33/00
[52] U.S. Cl. ........................ 437/19; 156/612; 427/53.1; 437/21; 437/84
[58] Field of Search ............ 148/1.5, 175, 187, 571; 29/576 B, 576 T; 427/53.1; 156/612

[56] References Cited

U.S. PATENT DOCUMENTS

| | | | |
|---|---|---|---|
| 4,406,709 | 9/1983 | Celler et al. ............... | 148/1.5 |
| 4,414,242 | 11/1983 | Nishimura et al. ......... | 148/DIG. 93 |
| 4,448,632 | 5/1984 | Akasaka .................... | 29/576 B |
| 4,543,133 | 9/1985 | Mukai ........................ | 148/1.5 |
| 4,545,823 | 10/1985 | Drowley .................... | 148/1.5 |
| 4,575,925 | 3/1986 | Kanbara et al. ............ | 29/576.5 |
| 4,576,851 | 3/1986 | Iwamatsu ................... | 29/576 B |
| 4,596,604 | 6/1986 | Akiyama et al. ........... | 148/1.5 |
| 4,619,034 | 10/1986 | Janning ...................... | 29/571 |

OTHER PUBLICATIONS

"Recrystallization of Si on Amorphous Substrates by Doughnut-Shaped cw Ar Laser Beam", by S. Kawamura et al., Applied Physics Letters 40(5), Mar. 1, 1982, pp. 394 and 395.

"The use of Beam Shaping to Achieve Large-Grain cw Laser-Recrystallized Polysilicon on Amorphous Substrates", by T. J. Stultz et al., Applied Physics Letters 39(5), Sep. 15, 1981, pp. 498 to 500.

Colinge et al., Appl. Phys. Letts. 41, (1982), 346.
Nishimura et al., Jap. Jour. Appl. Phys. 21, (1982), 169.
Egami et al., Appl. Phys. Letts. 44 (1984), 962.
Egami et al., Appl. Phys. Letts. 45 (1984), 854.

*Primary Examiner*—Upendra Roy
*Attorney, Agent, or Firm*—Birch, Stewart, Kolasch & Birch

[57] ABSTRACT

A process for the production of semiconductor devices comprising: (1) forming a first oxide film on a semiconductor substrate, (2) forming a groove or grooves on the first oxide film, (3) forming a first polycrystalline silicon film as an active layer on the whole surface of the first oxide film, (4) forming a second oxide film on the first polycrystalline silicon film, (5) forming a second polycrystalline silicon film on the second oxide film, said second polycrystalline silicon film serving as a buffer layer which absorbs the fluctuation of a scanning laser beam irradiating the first polycrystalline silicon film in step (7), (6) forming an anti-reflection film made of an oxide film on said buffer layer, and (7) irradiating the first polycrystalline silicon film with a scanning laser beam having a dual peak type power distribution to melt said first polycrystalline silicon film in such a manner that both peaks in the power distribution of the laser beam are positioned at both outer sides of said grooves, respectively, thereby achieving a single crystallization of said first polycrystalline silicon film serving as an active layer within each of said grooves in which said semiconductor devices are to be formed.

7 Claims, 16 Drawing Figures

Surface Morphology After Recrystallization of the Upper Layer 3b

FIG. 4(b)

Surface Morphology After Recrystallization of the Lower Layer 3a

FORMING SINGLE CRYSTAL SILICON ON INSULATOR BY IRRADIATING A LASER BEAM HAVING DUAL PEAK ENERGY DISTRIBUTION ONTO POLYSILICON ON A DIELECTRIC SUBSTRATE HAVING STEPS

BACKGROUND OF THE INVENTION

1. Field of the Invention

This invention relates to a process for the production of semiconductor devices, in which a SOI (Silicon on Insulator) technique is employed with a laser beam.

2. Description of the Related Art

To produce high speed integrated circuits and/or three-dimensional integrated circuits, research and development for SOI techniques, by which a single crystalline silicon layer can be formed on a silicon substrate covered with an insulating layer, have been carried out. One of the SOI techniques is a laser recrystallization method, which is especially applicable to the production of three-dimensional integrated circuits. The laser recrystallization method comprises forming a silicon oxide film on a silicon substrate and forming an amorphous or polycrystalline silicon film on the silicon oxide film, followed by irradiating the amorphous or polycrystalline silicon film with a scanning laser beam to achieve a single crystallization of the amorphous or polycrystalline silicon film. According to this method, in order to melt the silicon film by the irradiation of the scanning laser beam, the laser beam should be focused into a spot with a diameter of approximately 100 μm and scanned on the whole surface of the wafer. In order that a single crystalline region is created during recrystallization of the silicon film, the trailing edge (i.e., the interface between the solid region and the molten region) of the molten region of the silicon film must be concaved toward the molten region. An approach for attaining such a concaved trailing edge is essential for producing a single crystalline region.

There have been two kinds of approaches for the formation of the concave trailing edge of the molten region. For one of the two approaches, the silicon film to be recrystallized is made of a particular lamination structure to control the reflectivity and/or the thermal conductivity to the substrate, resulting in a concaved trailing edge. This approach is disadvantageous in that the single crystalline region must have a width of as small as approximately 20 μm since the trailing edge must be changed from convex to concave due to the particular structure of the sample film. This causes power losses.

Figure 14:
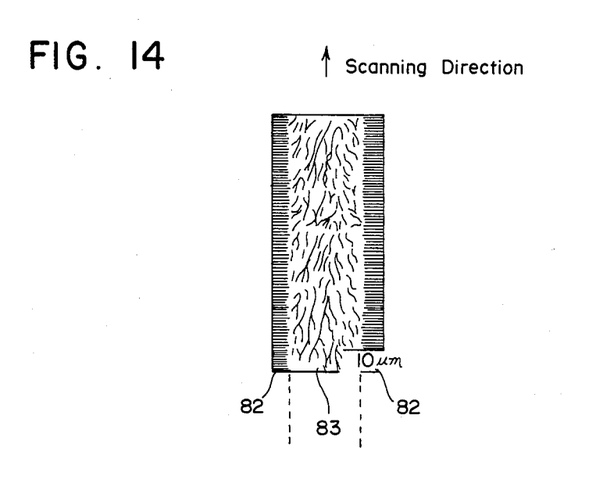
FIG. 14 is a diagram showing the recrystallization state achieved by the irradiation with the scanning Gaussian beam shown in FIG. 7(a).

In another approach, the Gaussian distribution of the laser beam is transformed into a dual peak type power distribution with peaks at both ends and a valley in the center portion, and then the silicon film is irradiated with the laser beam having a dual type power distribution resulting in a concaved trailing edge. When the Gaussian beam (FIG. 7(a)) is used for the irradiation of the sample film, the film is molten and a number of grains start to grow from both ends of the molten region of a low temperature to the center portion thereof of a high temperature, resulting in aggregation of polycrystals as shown in FIG. 14. Thus, the laser beam used for the achievement of a single recrystallization must exhibit a dual peak type power distribution rather than the Gaussian distribution. However, this approach is disadvantageous in that power losses of the laser beam are sometimes great, and even when the power losses are quite small, this approach is too sensitive to variations in the power distribution of the laser beam to stably create a single crystalline region so that subboundaries and/or twins tend to occur therein.

SUMMARY OF THE INVENTION

The process for the production of semiconductor devices of this invention which overcomes the above-discussed and numerous other disadvantages and deficiencies of the prior art, comprises (1) forming a first oxide film on a semiconductor substrate, (2) forming a groove or grooves on the first oxide film, (3) forming a first polycrystalline silicon film as an active layer on the whole surface of the first oxide film, (4) forming a second oxide film on the first polycrystalline silicon film, (5) forming a second polycrystalline silicon film on the second oxide film, said second polycrystalline silicon film serving as a buffer layer which absorbs the fluctuation of a scanning laser beam irradiating the first polycrystalline silicon film in step (7), (6) forming an antireflection film made of an oxide film on said buffer layer, and (7) irradiating the first polycrystalline silicon film with a scanning laser beam having a dual peak type power distribution to melt said first polycrystalline silicon film in such a manner that both peaks in the power distribution of the laser beam are positioned at both outer sides of said grooves, respectively, thereby achieving a single crystallization of said first polycrystalline silicon film serving as an active layer within each of said grooves in which said semiconductor devices are to be formed.

By the use of an optical system, the center of the Gaussian distribution of the power distribution of a laser beam is, in a preferred embodiment, split and the resulting halves are shifted and recombined, resulting in said scanning laser beam exhibiting a dual peak type power distribution with peaks at both ends and a valley in the center.

The optical system comprises, in a preferred embodiment, in turn a laser beam source 11, a first reflecting mirror, a beam expander, a pair of Fresnel biprisms, a second reflecting mirror, scanning optics, and a heater for heating a sample disposed thereon to be subjected to a recrystallization treatment, said pair of Fresnel biprisms being positioned in such a manner that the surface containing the vertical angle of the first Fresnel biprism faces the surface containing the vertical angle of the second Fresnel biprism and the plane surface of the first Fresnel biprism is parallel to the plane surface of the second Fresnel biprism.

The optical system comprises, in a preferred embodiment, in turn a laser beam source 11, a first reflecting mirror, a beam expander, a pair of V-shaped reflecting mirrors, a second reflecting mirror, scanning optics, and a heater for heating a sample disposed thereon to be subjected to a recrystallization treatment, said pair of V-shaped reflecting mirrors being positioned in such a manner that the reflecting surface containing the vertical angle $(\pi - \theta)$ of the first V-shaped mirror faces and is parallel to the reflecting surface containing the vertical angle $(\pi - \theta)$ of the second V-shaped mirror.

Thus, the invention described herein makes possible the objects of (1) providing a recrystallization process in which single crystallization of nonsingle crystalline thin films such as a polycrystalline silicon film, an amorphous silicon film, etc., can be stably attained on the whole region of a wafer, using a scanning laser beam having a power distribution with peaks at both ends and a valley in the center; (2) providing a process for the production of semiconductor devices in which good quality devices can be fabricated on the single crystalline region obtained by the abovementioned recrystallization process; (3) providing a process for the production of semiconductor devices from which three-dimensional integrated circuits can be produced; (4) providing an apparatus with a simple structure for the production of single crystalline thin films, which comprises a known laser-annealing apparatus and a pair of Fresnel biprisms or a pair of V-shaped reflecting mirrors; and (5) providing an apparatus for the emission of laser beam with a dual peak type power distribution which allows for the formation of widely striped single-crystalline regions on the non-single crystalline thin films.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The process for the production of semiconductor devices of this invention comprises forming a first oxide film on a semiconductor substrate; forming grooves on the area to be single-crystallized in such a manner that the bottom of each of the grooves does not penetrate the first oxide film; forming a first polycrystalline silicon film serving as an active layer on the whole surface of the first oxide film including the grooves; forming a second oxide film on the first polycrystalline silicon film serving as an active layer; forming a second polycrystalline silicon film on the second oxide film, said second polycrystalline silicon film serving as a buffer layer for absorbing the fluctuation of a scanning laser beam irradiating the first polycrystalline silicon film; forming an anti-reflection film made of an oxide film on the second polycrystalline silicon film serving as a buffer layer; irradiating the first polycrystalline silicon film with the scanning laser beam having a dual peak type power distribution to melt the first polycrystalline silicon film in such a manner that both peaks in the power distribution of the laser beam are positioned at both outer sides of the grooves, respectively, thereby achieving a single crystallization of the first polycrystalline silicon film serving as an active layer within each of the grooves in which the devices should be fabricated.

Since the thickness of the first oxide film in the area to be single-crystallized is smaller than that of the first oxide film at both sides of each of the grooves, and moreover as these thicker sides of the grooves are irradiated with a laser beam having a dual peak power distribution, the temperature distribution of the irradiated area exhibits a pattern in which the temperature in the center of the area to be single-crystallized is significantly lower than that of the outer sides of each of the grooves. This temperature distribution characteristic is maintained, and even though the power distribution of the laser beam varies to a certain extent, the above-mentioned temperature distribution never reverses, resulting in a high quality single crystal in the given area of the active layer. Moreover, turbulence at the interface between the solid area and the molten area in the active layer due to the fluctuation of the laser beam is made smooth by heat diffusion on the surface of the buffer layer positioned above the active layer, so that a stable single crystal growth can be attained in the active layer.

(Example 1) Single crystallization

Figure 1:
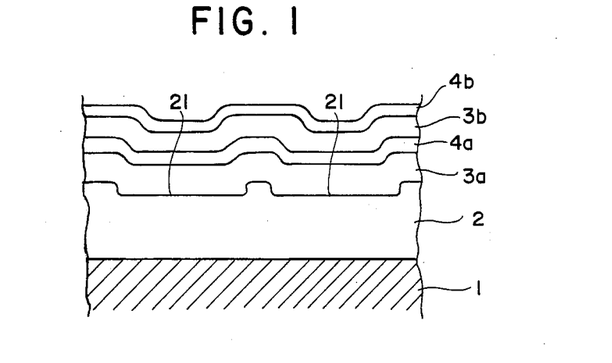
FIG. 1 is a sectional view of the area in a sample to be subjected to a recrystallization treatment where devices are to be fabricated according to this invention.

FIG. 1 shows the sectional view of the area in a sample to be subjected to a recrystallization treatment where devices should be fabricated. The sample is prepared as followed: On a silicon substrate 1, a silicon oxide film 2 having a thickness of 1.5 $\mu$m is formed. Then, grooves 21 having a depth of 0.3 $\mu$m, a width of 80 $\mu$m and a space therebetween of approximately 20 $\mu$m are formed in the area of the silicon oxide film 2 to be single-crystallized. The length of each of the grooves 21 is not limited. Then, on the whole area of the silicon oxide film 2 including the grooves 21, a polycrystalline silicon film 3a serving as an active layer and a silicon oxide film 4a are successively formed with a thickness of 0.5 $\mu$m and 0.2 $\mu$m, respectively, by chemical vapor deposition. On the whole area of the silicon oxide film 4a, a polycrystalline silicon film 3b serving as a buffer layer and a silicon oxide film 4b serving as an anti-reflection film are successively formed with a thickness of 0.5 μm and 0.26 μm, respectively, by chemical vapor deposition. The polycrystalline silicon film 3a is the layer on which devices should be fabricated, and the other polycrystalline silicon film 3b positioned above the polycrystalline silicon film 3a functions as a buffer layer.

Figure 2:
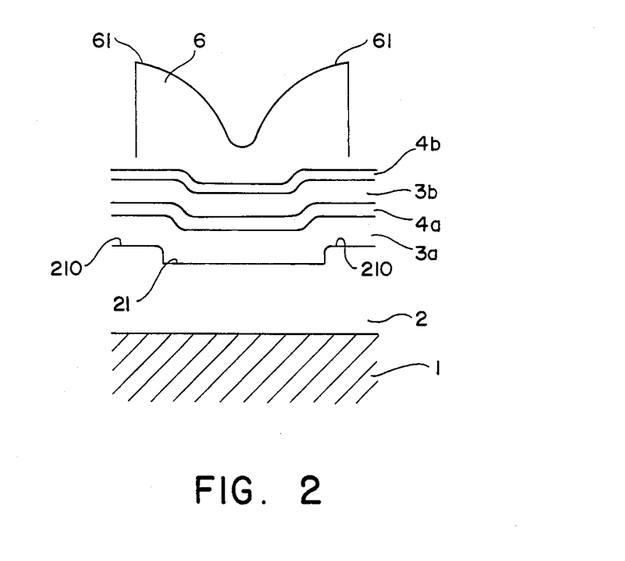
FIG. 2 is a diagram showing the positional relationship between a groove in the sample and the power distribution of the scanning laser beam.
Figure 3:
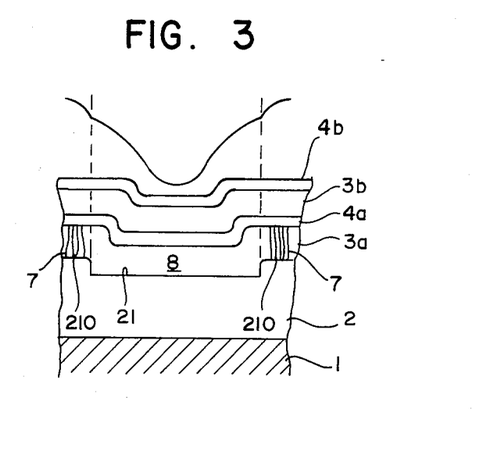
FIG. 3 is a diagram showing the temperature distribution of the sample.

The resulting sample is irradiated with a scanning argon laser beam (with a power of 7 watts and a scanning rate of 10 cm/sec.), which exhibits a dual peak type power distribution, in such a manner that, as shown in FIG. 2, both peaks 61 in the power distribution of the laser beam 6 are positioned at both outer sides 210 of each of the grooves 21. The resulting temperature distribution of the sample exhibits that, as shown in FIG. 3, the temperature of the center area of each of the grooves 21 is extremely low as compared with the outer sides 210 of each of the grooves 21. Thus, the center of each of the grooves 21 at the lowest temperature starts to be crystallized and crystallization stably proceeds toward both sides 210 of each of the grooves 21, resulting in a single crystalline region 8 within each of the grooves 21. Reference numeral 7 in FIG. 3 indicates subboundaries formed on the outer sides 210 of the grooves 21.

Figure 4A:
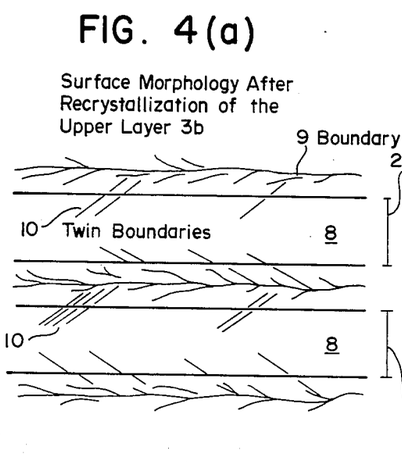
FIG. 4(a) is a diagram showing the crystalline state after achieving recrystallization of the buffer layer of FIG. 1 according to this invention.
Figure 4B:
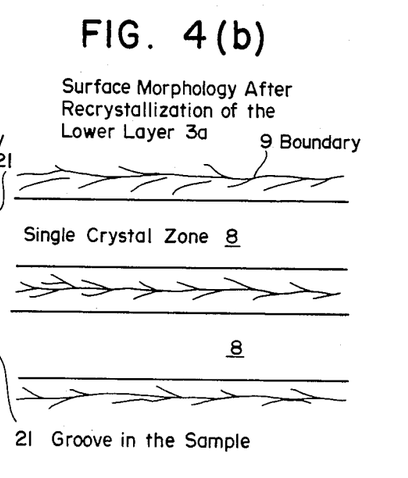
FIG. 4(b) is a diagram showing the crystalline state after achieving recrystallization of the active layer of FIG. 1 according to this invention.

According to the above-mentioned recrystallization process, both polycrystalline silicon films 3a and 3b in the grooves 21 are simultaneously single-crystallized. A comparison of the crystalline state (FIG. 4(a)) after achieving recrystallization of the buffer layer (the upper layer) 3b with the crystalline state (FIG. 4(b)) after recrystallization of the active layer (the lower layer) 3a is as follows: Subboundaries derived from the boundaries 9 are limited to the convex area of both the upper layer 3b and the lower layer 3a and do not extend to the area of each of the grooves 21 where devices should be fabricated. However, twin boundaries 10 exist in the region from the convex area to the concave area of the upper layer 3b. On the contrary, a perfect single crystal without twins was produced in the lower recrystalline layer 3a. This is because the turbulence at the interface between the solid area and the liquid area of the lower layer 3a due to variation in the laser beam 6 is smoothed by the heat diffusion on the surface of the upper layer 3b, so that the occurrence of twin boundaries in the lower layer 3a can be suppressed and a stable single-crystal growth can be attained in the lower layer 3a.

Then, the upper layer 3b is removed and high quality semiconductor devices are fabricated on the resulting single-recrystallized lower layer 3a by techniques known to those skilled in the art.

(Example 2) The formation of a dual peak type power distribution of laser beam by Fresnel's biprisms The dual peak type power distribution of the laser beam used for this invention can be transformed from the Gaussian distribution of a laser beam by optics such as Fresnel biprisms, V-shaped reflecting mirrors, etc.

Figure 5:
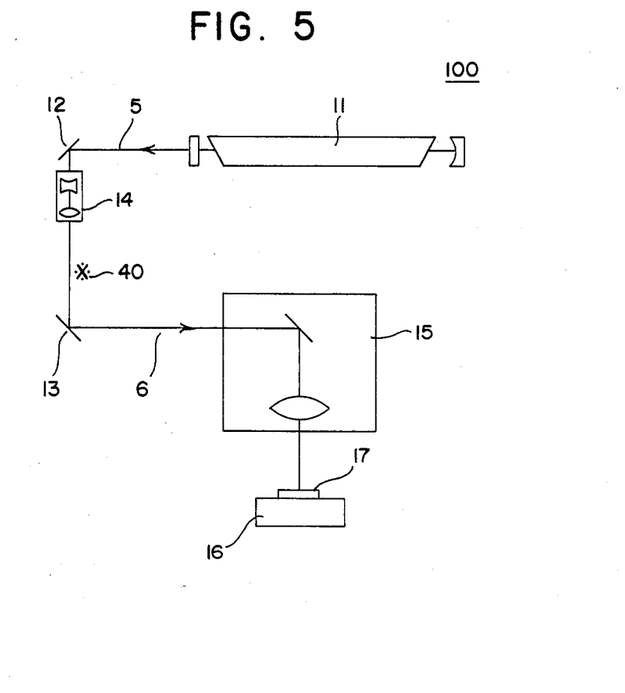
FIG. 5 is a diagram showing the optical system for the transformation of the Gaussian distribution of the scanning laser beam into a dual peak type power distribution.
Figure 6:
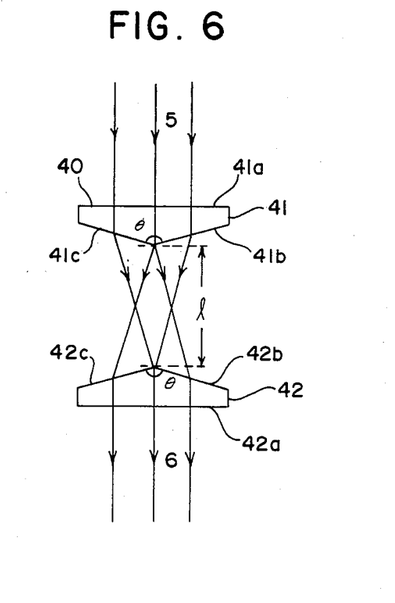
FIG. 6 is a diagram showing a pair of Fresnel biprisms used in the optical system shown in FIG. 5.
Figure 7A:
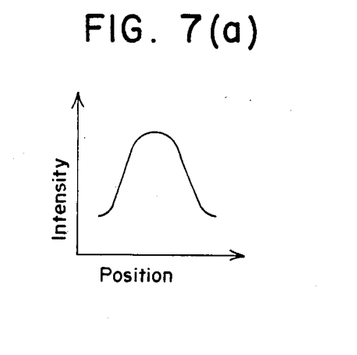
FIG. 7(a) is a graph showing the Gaussian distribution of the untransformed scanning laser beam.
Figure 7B:
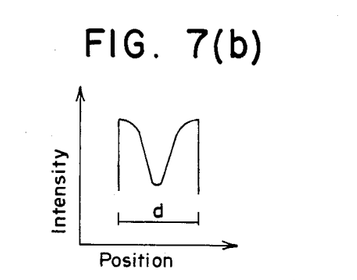
FIG. 7(b) is a graph showing the dual peak type power distribution of the scanning laser beam transformed by the optical system shown in FIG. 5.

FIG. 5 shows an example of an optical system used to transform the power distribution of a laser beam from the Gaussian distribution (FIG. 7(a)) into a dual peak type distribution (FIG. 7(b)) according to this invention, which comprises a known laser annealing apparatus 100 and a pair of Fresnel biprisms 40. The laser annealing apparatus 100 comprises in turn a laser beam source 11, reflecting mirrors 12 and 13, a beam expander 14, scanning optics 15, and a heater 16 for heating a sample 17, which is disposed thereon to be subjected to a recrystallization treatment according to the above-mentioned processes. The pair of Fresnel biprisms 40 are disposed between the beam expander 14 and the reflecting mirror 13 in such a manner that, as shown in FIG. 6, the surface containing the vertical angle $\theta$ of the first Fresnel biprism 41 faces the surface containing the vertical angle $\theta$ of the second Fresnel biprism 42 and the plane surface 41a of the first Fresnel biprism 41 is parallel to the plane surface 42a of the second Fresnel biprism.

The center of the Gaussian distribution of a laser beam 5 from the laser beam source 11 is split by the first Fresnel biprism 41, and one of the resulting halves reaches the surface 42c of the second Fresnel biprism 42 from the surface 41b of the first Fresnel biprism 41 and the other half reaches the surface 42b of the second Fresnel biprism 42 from the surface 41c of the first Fresnel biprism 41, by which these halves are shifted and recombined by the second Fresnel biprism 42, resulting in a laser beam 6, having a power distribution with peaks at both ends and a valley in the center as shown in FIG. 7(b).

The distance d between both peaks of the power distribution depends upon the vertical angle $\theta$ and refractive index n of the Fresnel biprisms 41 and 42, and the distance l therebetween. For the formation of the striped single crystalline zone in the active layer 3a (FIG. 3), the distance d is preferably selected to be approximately the diameter of the initial laser beam 5 with the Gaussian distribution. When the diameter of the laser beam emitted from the laser beam source 11 is 2.0 mm, the distance l between the Fresnel biprisms 41 and 42 is set to be approximately 83 mm, given that the magnification of the beam expander 14 is 2.5 and the vertical angle $\theta$ of each of the Fresnel biprisms 41 and 42 is 170°.

The laser beam 6 from the above-mentioned Fresnel biprisms 41 and 42 exhibits an M-shaped power distribution with peaks at both ends and a valley in the center as shown in FIG. 7(b). The distance between the two peaks of the power distribution of the resulting laser beam 6 is then reduced by the scanning optics 15 to adjust to several tens μm at a given position from the focus of the optics 15.

Figure 8:
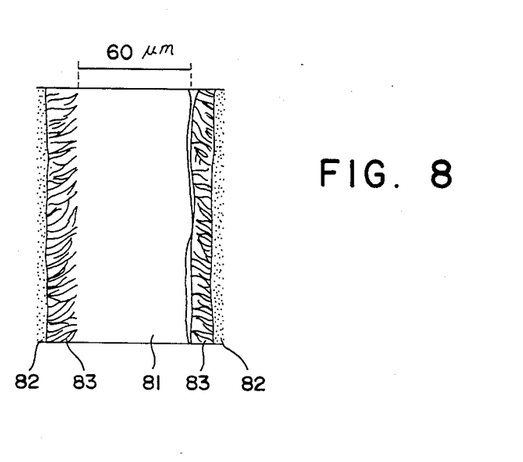
FIG. 8 is a diagram showing the recrystallization state achieved by the optical system shown in FIG. 5.
Figures 10, 11:
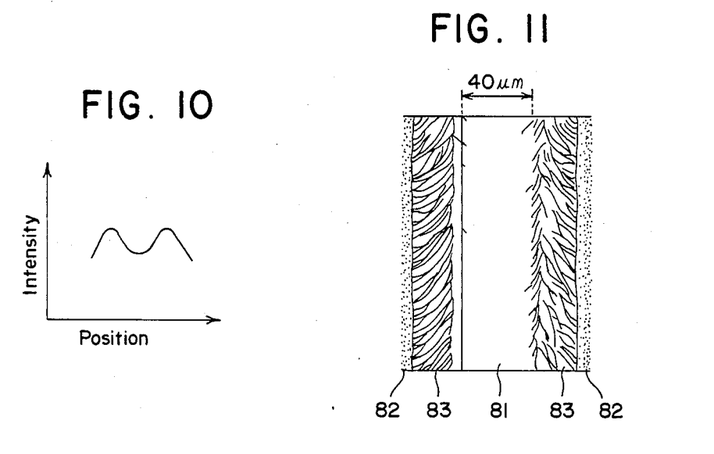
FIG. 10 is a graph showing a dual peak type power distribution of laser beam.
FIG. 11 is a diagram showing the recrystallization state achieved by the irradiation with the scanning laser beam having the power distribution shown in FIG. 10.
Figures 12, 13:
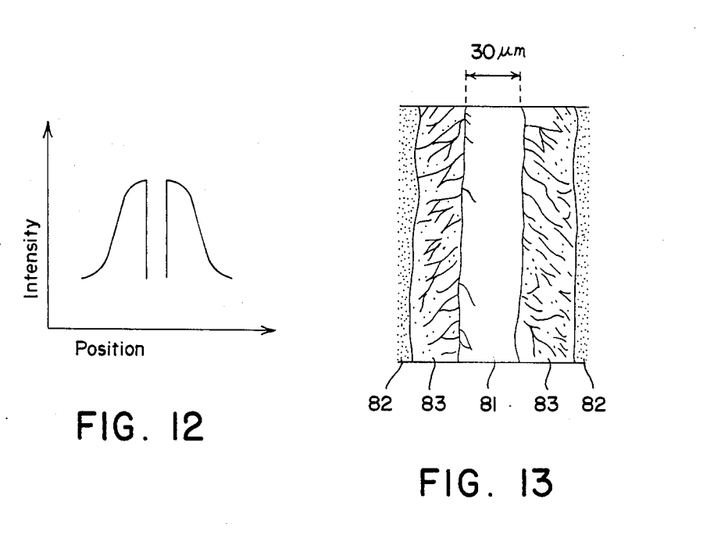
FIG. 12 is a graph showing a dual peak type power distribution of laser beam.
FIG. 13 is a diagram showing the recrystallization state achieved by the irradiation with the scanning laser beam having the power distribution shown in FIG. 12.

The laser beam with this M-shaped power distribution enables the formation of striped single-crystalline regions which are wider than those at the time when a laser beam with a power distribution of a type such as that shown in FIG. 10 or 12 is employed. If the laser beam 6 is converged at a position which is extremely close to the focus of the scanning optics 15, it will irradiate with a power distribution which is nearly equal to the power distribution shown in FIG. 10 due to diffraction. Thus, the sample 7 must be disposed at the position where the M-shaped power distribution shown in FIG. 7(b) can be realized. In this regard, more detailed description concerning single crystallization of a polycrystalline silicon is as follows:

On a silicon substrate, an oxide film having a thickness of 1 μm, a polycrystalline silicon film having a thickness of 600 nm and an silicon dioxide film having a thickness of 260 nm were successively formed. When the laser beam (a power of 7 watts) 6 having a diameter of 5 mm was converged by lenses having a focal distance of 70 mm and scanned at 40 mm/sec., the polycrystalline silicon film positioned above the substrate heated at 400° C. was effectively melted at the position of approximately 500 μm from the focus of the lenses. According to this experiment, in the case where any power distribution in FIGS. 10, 12 and 7(b) was applied to the irradiation of the polycrystalline silicon film, the region having a width of 25 μm out of the molten region having a width of approximately 50 μm was single-crystallized. On the other hand, when the laser power of 14 watts was adapted, the polycrystalline silicon film was effectively melted at the position of approximately 700 μm from the focus, resulting in the single-crystalline region 81 having a width of 40 μm (FIG. 11) out of the molten region having a width of approximately 80 μm for the power distribution shown in FIG. 10; the single-crystalline region 81 having a width of 30 μm (FIG. 13) out of the molten region having a width of approximately 80 μm for the power distribution shown in FIG. 12; and the single-crystalline region having a width of 60 μm (FIG. 8) out of the molten region having a width of approximately 80 μm for the power distribution shown in FIG. 7(b). Reference numerals 82 and 83 in the Figures, respectively, indicate the non-molten region and the polycrystalline region with increased grain diameters. This indicates that the laser beam with the M-shaped power distribution shown in FIG. 7(b) allows for the formation of the most widely striped single-crystalline region.

Figure 9:
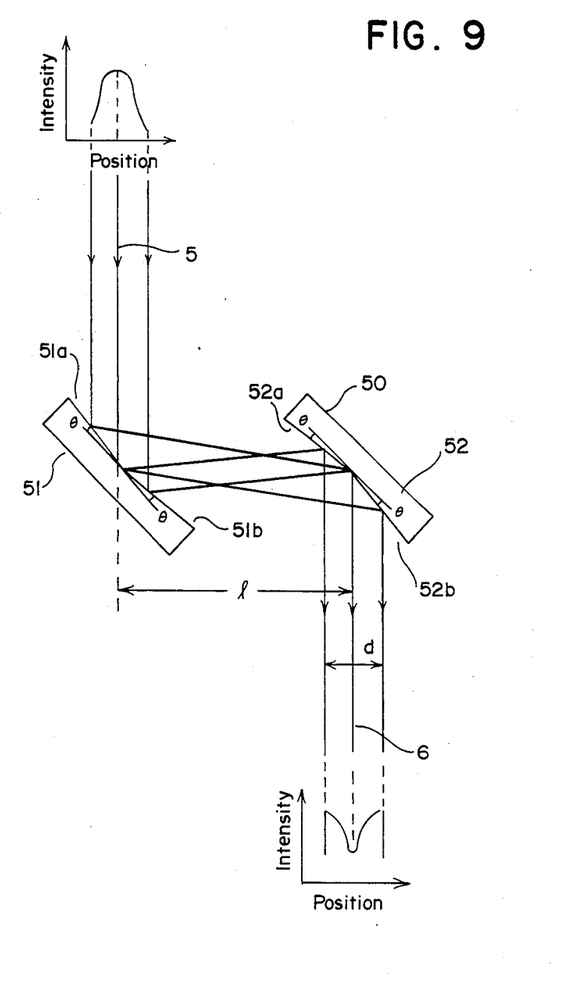
FIG. 9 is a diagram showing a pair of V-shaped reflecting mirrors used in the optical system shown in FIG. 5.

(Example 3) The formation of a dual peak type power distribution of a laser beam by V-shaped reflecting mirrors FIG. 9 shows the pair of V-shaped reflecting mirrors 50 which can be used instead of the Fresnel biprisms 40 (FIG. 6) in the optical system 100 (FIG. 5) for the transformation of the power distribution of the laser beam from the Gaussian distribution into a dual peak type distribution.

The pair of V-shaped reflecting mirrors 50 is positioned instead of the afore-mentioned Fresnel biprisms 40 in the optical system 100 in such a manner that the reflecting surface containing the vertical angle $(\pi - \theta)$ of the first V-shaped mirror 51 faces and is parallel to the reflecting surface containing the vertical angle $(\pi - \theta)$ of the second V-shaped mirror 52. The center of the Gaussian distribution of the laser beam 5 from the laser beam source 15 is split by the mirror surfaces 51a and 51b of the first mirror 51 and the reflected light having one of the resulting halves from the mirror surface 51a is incident upon the mirror surface 52b of the second mirror 52 while the reflected light having the other half from the mirror surface 51b of the first mirror 51 is incident upon the mirror surface 52a of the second mirror 52. These halves of the split power distribution are shifted and recombined by the mirror surfaces 52a and 52b of the second mirror 52, resulting in a dual peak type power distribution of the laser beam 6 with peaks at both ends and a valley in the center as shown in FIG. 9. The distance d between the two peaks of the power distribution of the laser beam 6 can be represented by the equation:

$$d = \frac{2l \tan 2\theta}{\tan 2\theta + \tan(\pi/4 - \theta)}$$

wherein l is the distance between the mirrors 51 and 52.

Thus, for the formation of a striped single-crystalline region in the polycrystalline silicon film, the distance d must be around the diameter of the laser beam. When the diameter of the laser beam 5 is 1.9 mm, the distance l is approximately 6.8 mm, given that the magnification of the beam expander 14 is 5 and the angle $\theta$ in the V-shape of each of the mirrors 51 and 52 is 2°.

A sample which was prepared by forming, on a silicon substrate, an oxide film having a thickness of 1 μm, a polycrystalline silicon film having a thickness of 600 nm and an oxide film having a thickness of 260 nm as an anti-reflection layer, in turn, was irradiated with the scanning laser beam (having a power of 10 watts and the diameter of 60 μm) 6 having a power distribution with peaks at both ends and a valley in the center (FIG. 10), resulting in the striped single-crystalline region 81 (FIG. 11) with a width of approximately 40 μm in the center of the molten region.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A process for the production of semiconductor devices, comprising the steps of:
    (1) forming a first oxide film on a semiconductor substrate;
    (2) forming a groove structure or groove structures on said first oxide film;
    (3) forming a first polycrystalline silicon film to serve as an active layer on said first oxide film so as to maintain said groove structures;
    (4) forming a second oxide film on said first polycrystalline silicon film so as to maintain said groove structures;
    (5) forming a second polycrystalline silicon film on said second oxide film so as to maintain said groove structures, said second polycrystalline silicon film serving as a buffer layer which absorbs the fluctuation of a scanning laser beam;
    (6) forming an anti-reflection film on said buffer layer so as to maintain said groove structures; and
    (7) irradiating said first polycrystalline silicon film through said anti-reflection film, said buffer layer and said second oxide film, with a scanning laser beam having a dual peak type power distribution to melt said first polycrystalline silicon film in such a manner that both peaks in the power distribution of said laser beam are positioned at outer sides of said groove structures, said outer sides of said groove structures corresponding to portions of said first oxide film that are thicker than those portions of said first oxide film with groove structures, thereby achieving a single crystallization of said first polycrystalline silicon film within each of said groove structures in which said semiconductor devices are to be formed.

2. A process for the production of semiconductor devices according to claim 1, further comprising the step of creating said scanning laser beam with an optical system in which the center of a Gaussian distribution of a power distribution of a laser beam is split and the resulting halves shifted recombined, resulting in said scanning laser beam exhibiting a dual peak type power distribution with peaks at both ends and a valley in the center.

3. A process for the production of semiconductor devices according to claim 1, wherein said semiconductor substrate comprises silicon, and wherein said first oxide film, said second oxide film, and said anti-reflection film comprise silicon oxide.

4. A process for the production of semiconductor devices according to claim 1, wherein said first polycrystalline silicon film, said second oxide film, said second polycrystalline silicon film, and said anti-reflection film are formed by chemical vapor deposition.

5. A process for the production of semiconductor devices according to claim 1, wherein said scanning laser beam comprises a scanning argon laser beam.

6. A process for the production of semiconductor devices according to claim 2, wherein said optical system comprises: a laser beam source, a first reflecting mirror, a beam expander, first and second Fresnel biprisms, a second reflecting mirror, scanning optics, and a heater for heating a sample disposed thereon to be subjected to a recrystallization treatment, wherein said first and second Fresnel biprisms are positioned in such a manner that the surface containing the vertical angle of said first Fresnel biprism faces the surface containing the vertical angle of said second Fresnel biprism and the plane surface of said first Fresnel biprism is parallel to the plane surface of said second Fresnel biprism.

7. A process for the production of semiconductor devices according to claim 2, wherein said optical system comprises: a laser beam source, a first reflecting mirror, a beam expander, first and second V-shaped reflecting mirrors, a second reflecting mirror, scanning optics, and a heater for heating a sample disposed thereon to be subjected to a recrystallization treatment, said first and second V-shaped reflecting mirrors being positioned in such a manner that the reflecting surface containing the vertical angle $(\pi - \theta)$ of said first V-shaped mirror faces and is parallel to the reflecting surface containing the vertical angle $(\pi - \theta)$ of said second V-shaped mirror.

* * * * *